US012757673B2

(12) United States Patent
Yin et al.

(10) Patent No.: US 12,757,673 B2
(45) Date of Patent: Oct. 6, 2026

(54) WORKPIECE TAPE REMOVING

(71) Applicant: YANGTZE MEMORY TECHNOLOGIES CO., LTD., Wuhan (CN)

(72) Inventors: Jinhua Yin, Wuhan (CN); Peng Chen, Wuhan (CN); Xinru Zeng, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 421 days.

(21) Appl. No.: 18/341,283

(22) Filed: Jun. 26, 2023

(65) Prior Publication Data

US 2024/0355651 A1 Oct. 24, 2024

(30) Foreign Application Priority Data

Apr. 19, 2023 (CN) ......................... 202310426648.4

(51) Int. Cl.

*H10P 72/00* (2026.01)
*H10P 72/70* (2026.01)
*H10W 42/20* (2026.01)

(52) U.S. Cl.

CPC ...... *H10P 72/0442* (2026.01); *H10P 72/7402* (2026.01); *H10P 72/7412* (2026.01); *H10P 72/7442* (2026.01); *H10W 42/20* (2026.01)

(58) Field of Classification Search

CPC ........... H01L 21/67132; H01L 21/6836; H01L 23/552; H01L 2221/68318; H01L 2221/68386; H01L 2221/68327; H01L 21/6838

USPC .......................................................... 438/106

See application file for complete search history.

(56) References Cited

U.S. PATENT DOCUMENTS

| | | | | |
|---|---|---|---|---|
| 5,009,735 A * | 4/1991 | Ametani | B29C 63/0013 | 156/716 |
| 7,122,447 B2 * | 10/2006 | Abe | H01L 21/67092 | 257/E21.705 |
| 7,598,120 B2 * | 10/2009 | Yamamoto | H01L 21/67132 | 438/106 |
| 7,798,195 B2 * | 9/2010 | Kobayashi | H01L 21/6835 | 156/707 |
| 10,207,487 B1 * | 2/2019 | Hockemeyer | B32B 38/10 | |
| 11,318,729 B2 * | 5/2022 | Qi | B32B 27/06 | |
| 11,545,386 B2 * | 1/2023 | Saito | H01L 21/67115 | |

(Continued)

*Primary Examiner* — Vu A Vu
(74) *Attorney, Agent, or Firm* — Conley Rose, P.C.

(57) ABSTRACT

The present disclosure relates to a tape removing device and a tape removing method. The present disclosure provides a tape removing device comprising: a working table; a suction nozzle; a workpiece for tape removing, the workpiece for tape removing including a support adhesive layer and at least one workpiece bonded to a side of the support adhesive layer, in which one side of the support adhesive layer provided with the at least one workpiece is facing the working table; and a guiding roll in contact with the other side of the support adhesive layer, wherein the suction nozzle fixes the workpiece for tape removing on the working table. Therefore, it is possible to avoid stripping off the support adhesive layer from the workpiece at a right angle, thereby reducing damages to the workpiece, which in turn can reduce the risk of invisible product cracks and improve product reliability.

20 Claims, 6 Drawing Sheets

(56) References Cited

U.S. PATENT DOCUMENTS

| | | | | |
|---|---|---|---|---|
| 11,756,809 | B2 * | 9/2023 | Saito | H01L 21/67132 156/367 |
| 11,964,459 | B1 * | 4/2024 | Adams | B32B 43/006 |
| 12,094,742 | B2 * | 9/2024 | Saito | B23K 26/402 |
| 2010/0300612 | A1 * | 12/2010 | Yamamoto | H01L 21/67132 156/538 |

* cited by examiner

WORKPIECE TAPE REMOVING

CROSS-REFERENCE TO RELATED APPLICATIONS

The present application claims priority to Chinese Patent Application No. 202310426648.4, which was filed Apr. 19, 2023, is titled "A TAPE REMOVING DEVICE AND A TAPE REMOVING METHOD," and is hereby incorporated herein by reference in its entirety.

TECHNICAL FIELD

The present disclosure relates to the field of semiconductor technologies, and more particularly to a tape removing device and a tape removing method.

BACKGROUND

To address challenges related to electromagnetic radiation and electromagnetic interference in semiconductor devices, electromagnetic shield layers may be introduced in the packaging process. While introducing the electromagnetic shield layers, the products are generally first attached to tapes and then plated with films to form the electromagnetic shield layers on external surfaces of products. Thereafter, the products and the tapes are separated by a tape removing process to obtain semiconductor devices with electromagnetic shield layers.

SUMMARY

Examples of the present disclosure provide a tape removing device and a tape removing method to address challenges in which invisible cracks tend to occur in products, so as to improve product reliability.

The present disclosure provides a tape removing device comprising: a working table; a suction nozzle; a workpiece for tape removing, the workpiece for tape removing including a support adhesive layer and at least one workpiece bonded to a side of the support adhesive layer, in which one side of the support adhesive layer provided with the at least one workpiece is facing the working table; and a guiding roll in contact with the other side of the support adhesive layer, wherein the suction nozzle fixes the workpiece for tape removing on the working table.

The tape removing device further includes a pulling tape, wherein the pulling tape is coupled to an edge of the support adhesive layer.

An adhesiveness of the pulling tape is greater than that of the support adhesive layer.

The tape removing device further includes a collecting unit coupled to the pulling tape.

The collecting unit collects the support adhesive layer after separation from the workpiece.

The support adhesive layer is separated from the workpiece at a preset angle through the guiding roll, and the preset angle is smaller than 90 degrees.

The workpiece for tape removing further includes at least one bonding adhesive layer located between the support adhesive layer and the at least one workpiece, wherein the at least one workpiece is bonded with the support adhesive layer respectively by the at least one bonding adhesive layer. The support adhesive layer and the bonding adhesive layer are separated from the workpiece at the preset angle after being guided by the guiding roll.

The preset angle is between 30 to 60 degrees.

The tape removing device further includes multiple suction nozzles, wherein a number of the suction nozzles corresponds one to one with a number of workpieces of the workpiece for tape removing.

The guiding roll is a cylinder and a cross-section shape of the cylinder comprises a circle, oval or polygon.

The present disclosure further provides a tape removing method comprising: fixing a workpiece for tape removing on a working table, the workpiece for tape removing including a support adhesive layer and at least one workpiece bonded to a side of the support adhesive layer, the side of the support adhesive layer on which the at least one workpiece is disposed facing the working table; and separating the support adhesive layer from the workpiece at a preset angle smaller than 90 degrees after the support adhesive layer is guided a the guiding roll.

Separating the support adhesive layer from the workpiece at the preset angle after the support adhesive layer is guided by the guiding roll includes: connecting a pulling tape to an edge of the support adhesive layer; and driving, with the pulling tape, the edge of the support adhesive layer to move in a preset direction after the edge of the support adhesive layer is guided by the guiding roll. This may separate the support adhesive layer from the workpiece at the preset angle with the axial direction of the guiding roll intersecting with the preset direction.

An adhesiveness of the pulling tape is greater than that of the support adhesive layer.

The tape removing method further includes: bringing the guiding roll to contact a surface of the support adhesive layer away from the at least one workpiece before separating the support adhesive layer from the workpiece.

The tape removing method further includes: collecting the separated support adhesive layer.

Collecting the separated support adhesive layer includes: connecting the pulling tape to a collecting unit; and collecting the separated support adhesive layer through the collecting unit.

At least one suction nozzle is disposed on the working table, and fixing the workpiece for tape removing on the working table includes sucking and fixing the at least one workpiece on the working table by the at least one suction nozzle.

The workpiece for tape removing further includes at least one bonding adhesive layer located between the support adhesive layer and the at least one workpiece, wherein the at least one workpiece is bonded with the support adhesive layer by the at least one bonding adhesive layer. Separating the support adhesive layer from the workpiece at the preset angle after the support adhesive layer is guided by the guiding roll includes: separating the support adhesive layer and the bonding adhesive layer from the workpiece at the preset angle after the support adhesive layer and the bonding adhesive layer are guided by the guiding roll.

The guiding roll is a cylinder and a cross-section shape of the cylinder includes circle, oval or polygon.

The preset angle is between 30 to 60 degrees.

In some examples, to at least partially mitigate the above-described challenges in which invisible cracks tend to occur in products, when removing a support adhesive layer, it is possible to strip the support adhesive layer off a workpiece at an angle smaller than 90 degrees, thereby avoiding tearing the support adhesive layer from the workpiece at a right angle. Therefore, it is possible to reduce the stripping force on the workpiece to reduce damages to the workpiece, which in turn can reduce the risk of invisible product cracks and improve product reliability.

BRIEF DESCRIPTION OF THE DRAWINGS

To explain the technical solutions in implementations of the present disclosure more clearly, accompanying drawings for use in describing implementations will be described in brief below. The below described drawings are only some implementations of the present disclosure and other drawings may be obtained according to these drawings.

DETAILED DESCRIPTION

The present disclosure will be described in detail hereafter with reference to accompanying drawings and implementations. The following implementations are only used to illustrate the present disclosure and not to define its scope. Likewise, the following implementations are only some, not all, of the implementations of the present disclosure, and all other implementations obtained by those of ordinary skills in the art without any creative works fall within the scope claimed by the present disclosure.

In addition, while describing a structure of a component, if a layer or a region is described as being "on" or "over" another layer or another region, it may be directly on the another layer or the another region, or there may be other layer(s) or region(s) between it and the another layer or the another region. Further, if the component is inverted, the layer or the region will be located "under" or "beneath" the another layer or the another region. In addition, the features, structures, or characteristics described below may be incorporated in one or more implementations in any suitable manners.

Figure 1:
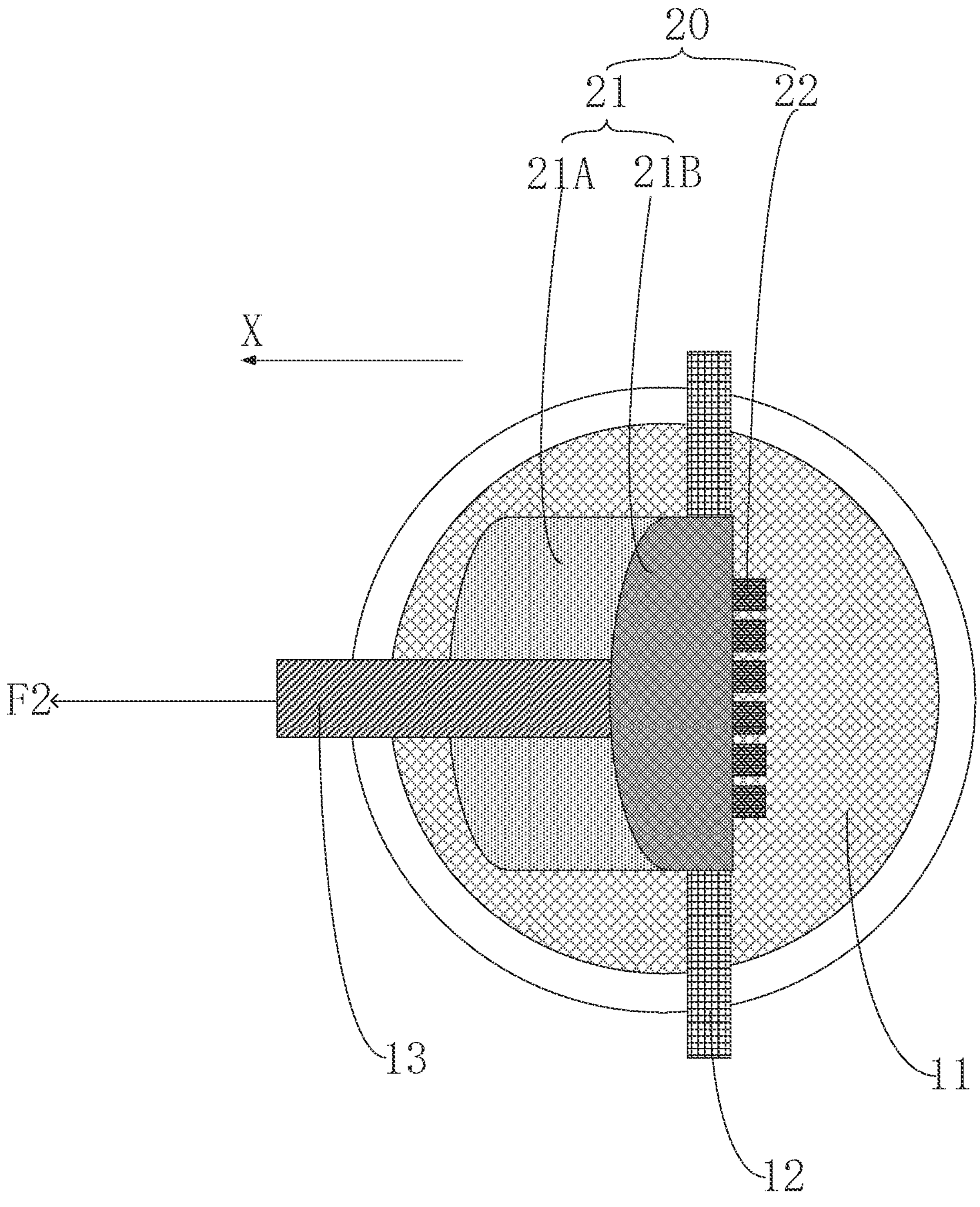
FIG. 1 is a schematic structure top view of a tape removing device provided in an implementation of the present disclosure while removing a support adhesive layer.
Figure 2:
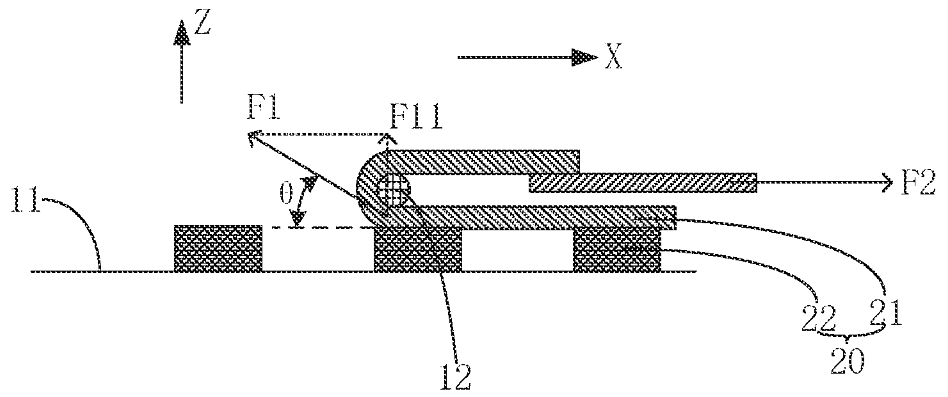
FIG. 2 is a schematic structure sectional view of a tape removing device provided in an implementation of the present disclosure while removing a support adhesive layer.
Figure 3:
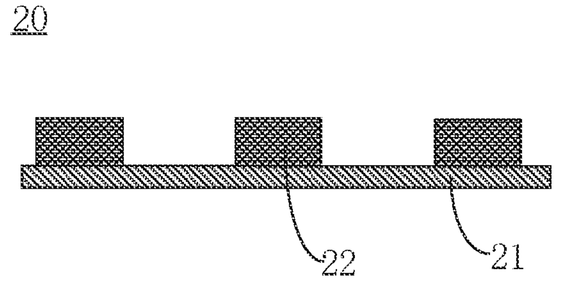
FIG. 3 is a schematic structure sectional view of a workpiece for tape removing as provided by an implementation of the present disclosure.

Referring to FIGS. 1 to 3, FIG. 1 is a schematic structure top view of a tape removing device provided in an implementation of the present disclosure while removing a support adhesive layer; FIG. 2 is a schematic structure sectional view of a tape removing device provided in an implementation of the present disclosure while removing a support adhesive layer; and FIG. 3 is a schematic structure sectional view of a workpiece for tape removing as provided by an implementation of the present disclosure. As shown in FIGS. 1 to 3, the tape removing device includes a working table 11, a guiding roll 12, a fixing unit and a separating unit, wherein the fixing unit is configured to fix the workpiece for tape removing 20 on the working table 11, the workpiece for tape removing 20 includes a support adhesive layer 21 and at least one workpiece 22 bonded to a side of the support adhesive layer 21. While the fixing unit is fixing the workpiece for tape removing 20 on the working table 11, the side of the support adhesive layer 21 in the workpiece for tape removing 20, on which the at least one workpiece 22 is disposed, faces the working table 11. The separating unit is configured to separate the support adhesive layer 21 from the workpiece 22 at a preset angle θ after being guided by the guiding roll 12, wherein the preset angle θ is smaller than 90 degrees.

In the workpiece for tape removing 20, each workpiece 22 may have opposite front side and back side, and the back side of the at least one workpiece 22 may be bonded to the same surface 21B of the support adhesive layer 21. The fixing unit may fix the workpiece for tape removing 20 on the working table 11 by fixing the front side of the workpiece 22 in the workpiece for tape removing 20 to the working table 11.

In some implementations, the support adhesive layer 21 may be an adhesive layer with single-sided or double-sided adhesiveness, and as shown in FIGS. 1 to 3, the at least one workpiece 22 may be directly bonded and fixed on the same surface 21B with adhesiveness of the support adhesive layer 21. In some examples, the material for the support adhesive layer 21 may include polyimide. For example, the support adhesive layer 21 may be a polyimide tape.

Figure 4:
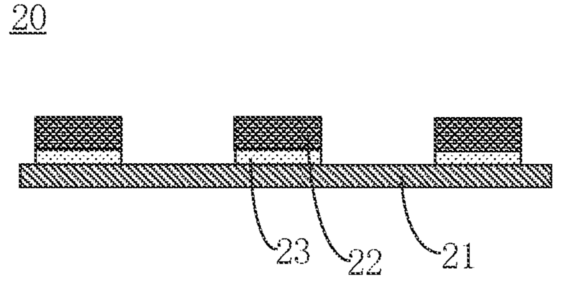
FIG. 4 is another schematic structure sectional view of a workpiece for tape removing as provided by an implementation of the present disclosure.

In some other implementations, as shown in FIG. 4, the workpiece for tape removing 20 may further include at least one bonding adhesive layer 23 located between the support adhesive layer 21 and the at least one workpiece 22, and the at least one workpiece 22 may be bonded with the support adhesive layer 21 by the at least one bonding adhesive layer 23.

In the workpiece for tape removing 20, the at least one workpiece 22 may be in one-to-one correspondence with the at least one bonding adhesive layer 23 and each workpiece 22 may be bonded with the support adhesive layer 21 through its one corresponding bonding adhesive layer 23.

Further, the separating unit may be configured to separate the support adhesive layer 21 and the bonding adhesive layer 23 from the workpiece 22 at a preset angle θ after the support adhesive layer 21 and the bonding adhesive layer 23 are guided by the guiding roll 12. While the separating unit is separating the support adhesive layer 21 and the bonding adhesive layer 23 from the workpiece 22 at a preset angle θ after being guided by the guiding roll 12, the support adhesive layer 21 and the bonding adhesive layer 23 as a whole may be torn off the at least one workpiece 22, that is, the removed support adhesive layer 21 and the bonding adhesive layer 23 are still bonded together.

In some implementations, the adhesiveness of the support adhesive layer 21 may be greater than that of the bonding adhesive layer 23. In this way, the bonding force between the support adhesive layer 21 and the bonding adhesive layer 23 in the workpiece for tape removing 20 can be greater than the bonding force between the bonding adhesive layer 23 and the workpiece 22. This enables the bonding adhesive layer 23 to separate from the workpiece 22 rather than from the support adhesive layer 21 while the separating unit is separating the support adhesive layer 21 and the bonding adhesive layer 23 from the workpiece 22 at the preset angle θ after being guided by the guiding roll 12, thereby providing that the support adhesive layer 21 and the bonding adhesive layer 23 as a whole can be torn off the at least one workpiece 22.

In other implementations, before the separating unit is separating the support adhesive layer 21 and the bonding adhesive layer 23 from the workpiece 22 at the preset angle θ after being guided by the guiding roll 12, the tape removing device may further reduce the adhesiveness of the bonding adhesive layer 23 in the workpiece for tape removing 20 such that the bonding adhesive layer 23 in the workpiece for tape removing 20 can separate from the workpiece 22 easier.

For example, the bonding adhesive layer 23 may be sensitive to an ultraviolet ray (UV), and under the irradiation of the ultraviolet ray, the adhesiveness of the bonding adhesive layer 23 would be reduced. In some examples, the material for forming the bonding adhesive layer 23 may include an ultraviolet adhesive. For example, the bonding adhesive layer 23 may be an ultraviolet adhesive layer and may be an adhesive layer with double-sided adhesiveness. Therefore, while reducing the adhesiveness of the bonding adhesive layer 23 in the workpiece for tape removing 20, the tape removing device may achieve the object of reducing the adhesiveness of the bonding adhesive layer 23 by irradiating the ultraviolet ray to the bonding adhesive layer 23 in the workpiece for tape removing 20.

In some implementations, the workpiece 22 may be a semiconductor wafer, a semiconductor chip or a semiconductor package. Among them, the semiconductor wafer may be a three-dimensional memory array wafer or a peripheral circuit wafer. The semiconductor chip may be formed by cutting the semiconductor wafer and may be a three-dimensional memory array chip such as a NAND flash memory chip or a peripheral circuit chip. The semiconductor package may be obtained by packaging one or more semiconductor chips.

Figure 5:
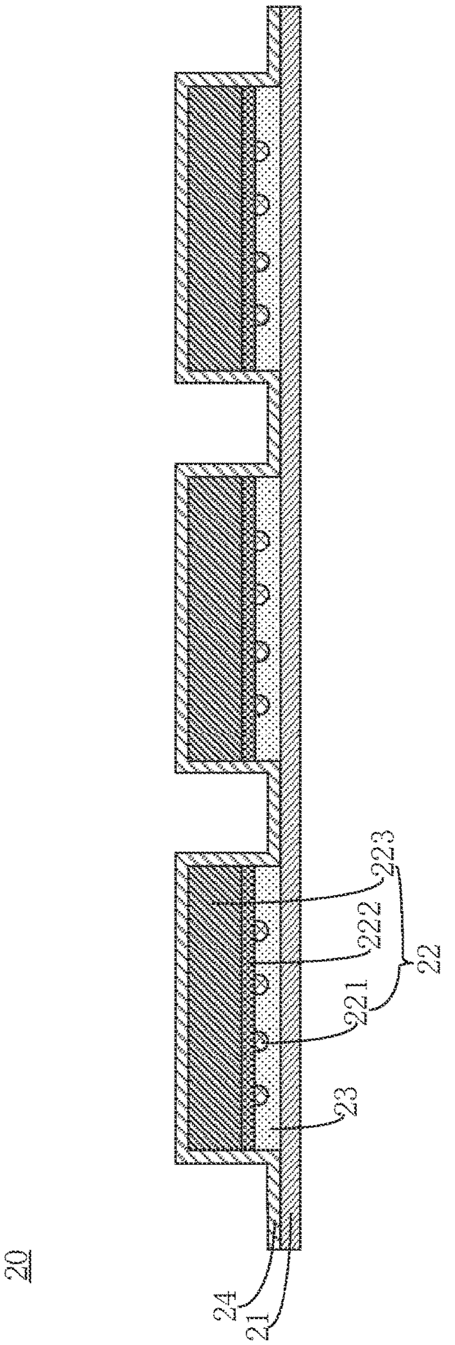
FIG. 5 is another schematic structure sectional view of a workpiece for tape removing as provided by an implementation of the present disclosure.

In the implementation in which the workpiece 22 is a semiconductor package, as shown in FIG. 5, the workpiece 22 may be a ball grid array (BGA) package. The workpiece 22 includes a plurality of solder balls 221 projecting from its back side (e.g., bottom surface). The plurality of solder balls 221 may be arranged in an array, and the material of solder balls 221 may include conductive materials such as soldering tin. In some examples, as shown in FIG. 5, the workpiece 22 may further include a redistribution layer 222 and a package 223, wherein the package 223 may have one or more semiconductor chips packaged therein, the redistribution layer 222 is disposed on a side of the package 223, the plurality of solder balls 221 may be disposed on a side of the redistribution layer 222 away from the package 223, and the solder balls 221 may be electrically connected with the semiconductor chip in the package 223 through the redistribution lines in the redistribution layer 222.

In the implementation in which the workpiece 22 and the support adhesive layer 21 are bonded together by the bonding adhesive layer 23, the thickness of the bonding adhesive layer 23 may be greater than the maximum projection height of the solder balls 221 with respect to the bottom surface of the workpiece 22, which in turn enables the bonding adhesive layer 23 to completely cover outer surfaces of the plurality of solder balls 221 while being bonded to the bottom surface of the workpiece 22, thereby protecting the plurality of solder balls 221.

In some implementations, as shown in FIG. 5, the workpiece for tape removing 20 may further include an electromagnetic shield layer 24, and the electromagnetic shield layer 24 is disposed on a side of the support adhesive layer 21 on which the at least one workpiece 22 is disposed, and covers the at least one workpiece 22 for electromagnetic interference protection of workpieces 22.

In some examples, the process of manufacturing the workpiece for tape removing 20 may include providing a support adhesive layer 21; bonding a back side of the at least one workpiece 22 to a surface of the support adhesive layer 21; and forming an electromagnetic shield layer 24 covering the at least one workpiece 22 on the surface of the support adhesive layer 21 bonded with the at least one workpiece 22, thereby obtaining the workpiece for tape removing 20 including the support adhesive layer 21, the at least one workpiece 22 and the electromagnetic shield layer 24.

In some examples, the material for the electromagnetic shield layer 24 may include but not limited to metal materials with electromagnetic shield function. In an implementation, the electromagnetic shield layer 24 may be formed on the surface of the support adhesive layer 21 bonded with the at least one workpiece 22 by a spray coating process. The electromagnetic shield layer 24 may completely cover front side and all lateral sides of individual workpieces 22 and does not cover back side of individual workpieces 22. This may avoid the occurrence of short circuits between the electromagnetic shield layer 24 and solder balls 221 or electrodes on the back side of the workpieces 22.

In the implementation in which the workpiece for tape removing 20 includes at least one bonding adhesive layer 23 and each workpiece 22 may be bonded with the support adhesive layer 21 through its one corresponding bonding adhesive layer 23, the orthogonal projection of each workpiece 22 in the workpiece for tape removing 20 on the support adhesive layer 21 may be located within the orthogonal projection of its one corresponding bonding adhesive layer 23 on the support adhesive layer 21. This may avoid adverse effects on electrical performance of workpieces 22 due to the formed electromagnetic shield layer 24 covering partial bottom surface (or back side) of the workpieces 22 in the process of forming the electromagnetic shield layer 24.

Figure 6:
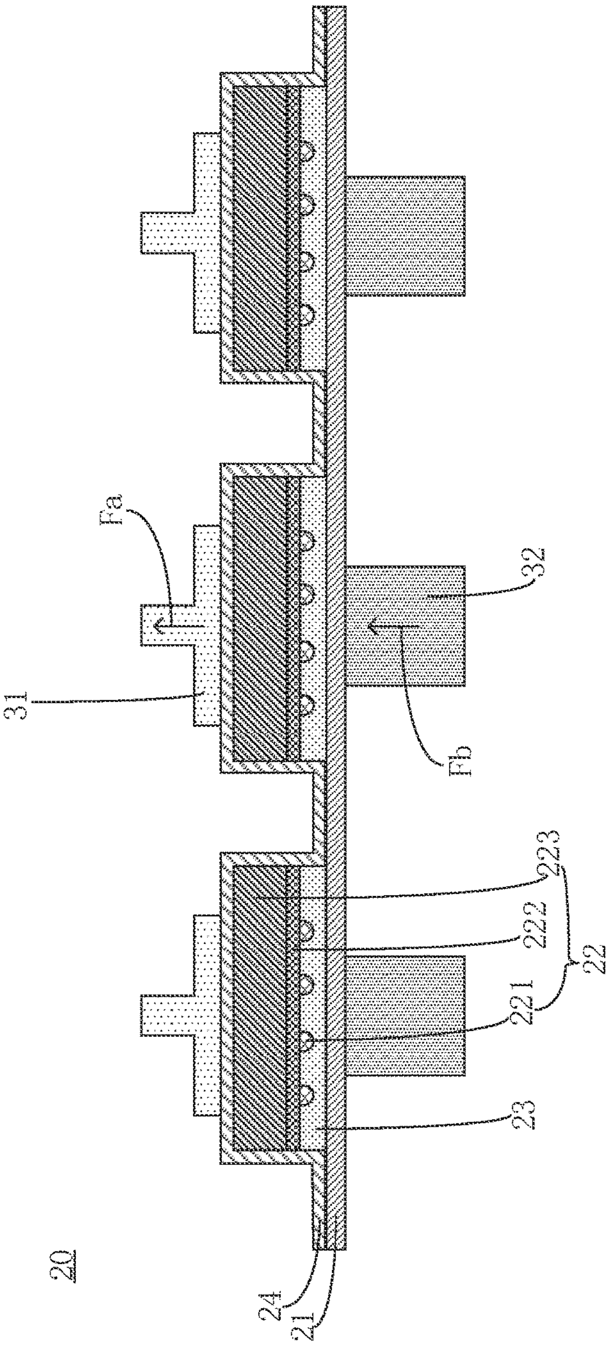
FIG. 6 is a schematic structure sectional view of a tape removing device provided in another implementation of the present disclosure in a start stage of removing a support adhesive layer.
Figure 7:
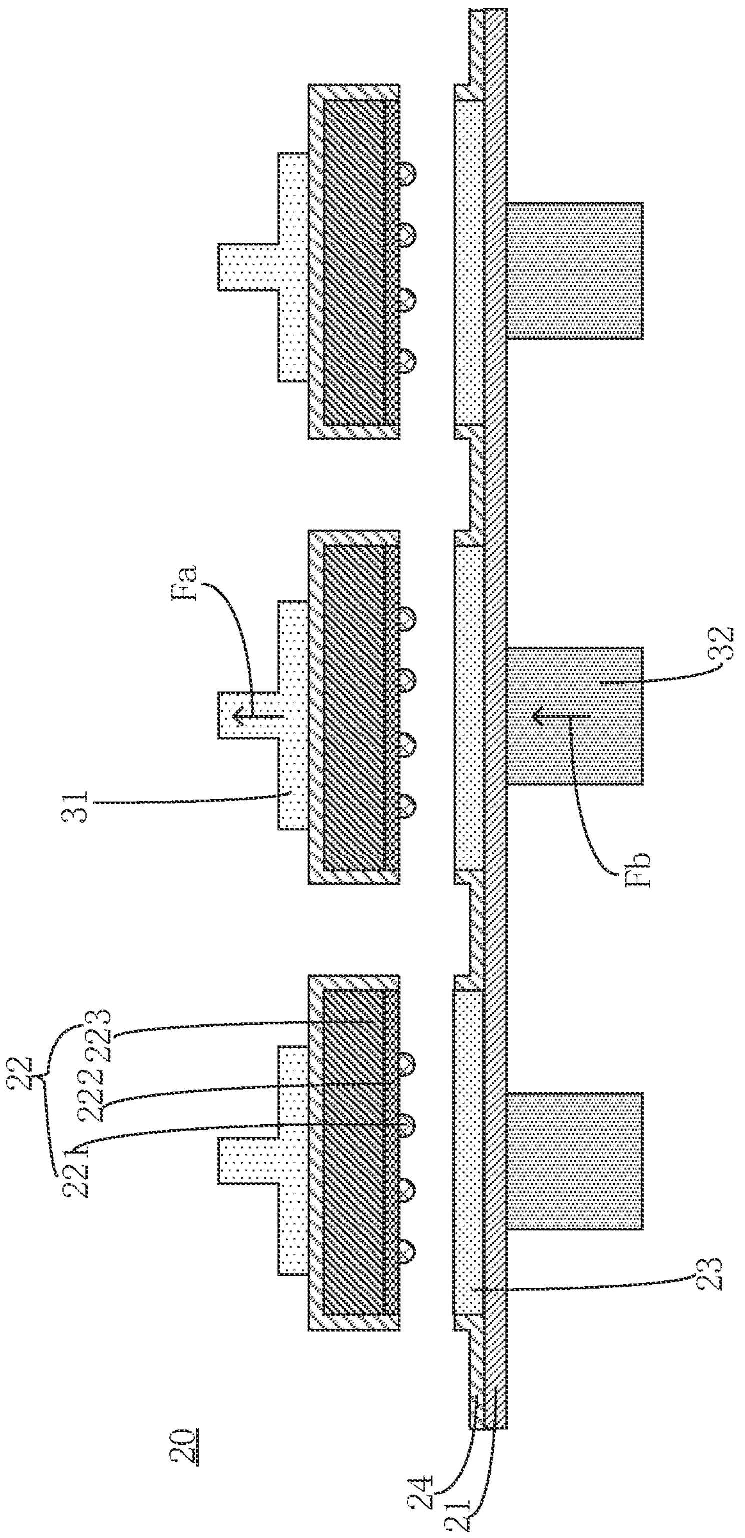
FIG. 7 is a schematic structure sectional view of a tape removing device provided in another implementation of the present disclosure in an end stage of removing a support adhesive layer.

It is to be noted that with respect to the solution as shown in FIGS. 6 and 7 in which the support adhesive layer 21 is torn off the workpiece 22 at a right angle (that is, the workpiece for tape removing 20 is fixed on the workbench with the support adhesive layer 21 facing down first, then an upward force Fa is applied to the workpiece for tape removing 20 by the suction nozzle 31 at a position directly above the workpiece for tape removing 20 and corresponding to the workpiece 22, and at the same time an upward force Fb is applied to the workpiece for tape removing 20 by the pin 32 at a position directly below the workpiece for tape removing 20 and corresponding to the workpiece 22, such that the support adhesive layer 21 and the workpiece 22 in the workpiece for tape removing 20 can be separated under the action of both forces), a large stripping force needs to be generated to the workpiece 22 in the workpiece for tape removing 20. Therefore, invisible cracks such as invisible cracks in chips inside the semiconductor package tend to occur to the workpiece 22 in the process of separating the support adhesive layer 21 and the workpiece 22. Also, when the whole of the surface of the support adhesive layer 21 that is bonded with the at least one workpiece 22 is covered with the electromagnetic shield layer 24, since the electromagnetic shield layer 24 is subject to a large break force, many metal burrs may be generated at the breakage of the electromagnetic shield layer, which in turn impacts the reliability of the completed products.

In implementations of the present disclosure, with the solution in which the support adhesive layer 21 is separated from the workpiece 22 at a preset angle θ smaller than 90 degrees, it is possible to effectively reduce the stripping force generated for the workpiece 22 in the workpiece for tape removing 20 in the process of separating the support adhesive layer 21 from the workpiece 22. Thus, it is possible to reduce the risk of invisible cracks in the workpiece 22 in the process of separating the support adhesive layer 21 from the workpiece 22. This may further effectively reduce the break force experienced by the electromagnetic shield layer 24 in the application scenario in which the whole of the surface of the support adhesive layer 21 that is bonded with the at least one workpiece 22 is covered with the electromagnetic shield layer 24. This may in turn reduce metal burrs generated at the breakage of the electromagnetic shield layer 24, thereby improving reliability of the completed products.

The process in the present implementation in which the support adhesive layer 21 is separated from the workpiece 22 at the preset angle θ smaller than 90 degrees may include three stages. In the first stage (e.g., start stage), the support adhesive layer 21 in the workpiece for tape removing 20 is not separated from the workpiece 22 yet, and the whole of the corresponding support adhesive layer 21 is the support adhesive layer 21 to be torn. In the second stage (e.g., middle stage), the support adhesive layer 21 in the workpiece for tape removing 20 has been separated partially from the workpiece 22 but not completely separated from the workpiece 22 yet, and a part of the corresponding support adhesive layer 21 is the torn support adhesive layer 21 and the remaining part thereof is the support adhesive layer 21 to be torn. In the third stage (e.g., end stage), the support adhesive layer 21 in the workpiece for tape removing 20 is separated completely from the workpiece 22, and the whole of the corresponding support adhesive layer 21 is the torn support adhesive layer 21.

As shown in FIGS. 1 and 2, when the separating unit in the tape removing device is separating the support adhesive layer 21 from the workpiece 22 at the preset angle θ smaller than 90 degrees after the support adhesive layer 21 is guided by the guiding roll 12, the separating unit in the tape removing device may perform an operation of applying a pulling force F1 to the support adhesive layer 21 to be torn in the workpiece for tape removing 20 by the guiding roll 12 at an angle (namely the preset angle θ) smaller than 90 degrees with respect to the plane in which the support adhesive layer 21 to be torn is located, such that the support adhesive layer 21 to be torn in the workpiece for tape removing 20 can detach from the workpiece 22 at the preset angle θ smaller than 90 degrees.

In some implementations, as shown in FIGS. 1 and 2, in the process of separating the support adhesive layer 21 from the workpiece 22 at the preset angle θ smaller than 90 degrees, the separating unit in the tape removing device may apply a pulling force F1 to the edge of the support adhesive layer 21 to be torn in the workpiece for tape removing 20 by the guiding roll 12 at an angle smaller than 90 degrees with respect to the plane in which the support adhesive layer 21 to be torn is located, such that the support adhesive layer 21 to be torn in the workpiece for tape removing 20 can detach gradually from the workpiece 22 at the preset angle θ smaller than 90 degrees starting from its edge. In some examples, the preset angle θ may be between 30 to 60 degrees, such as 45 degrees.

As shown in FIG. 2, the component force F11 of the pulling force F1 in the direction perpendicular to the workpiece 22 in the workpiece for tape removing 20 should be greater than the bonding force between the support adhesive layer 21 to be torn in the workpiece for tape removing 20 and the workpiece 22 to provide that under the action of the pulling force F1, the support adhesive layer 21 to be torn in the workpiece for tape removing 20 can separate from the workpiece 22.

Figure 8:
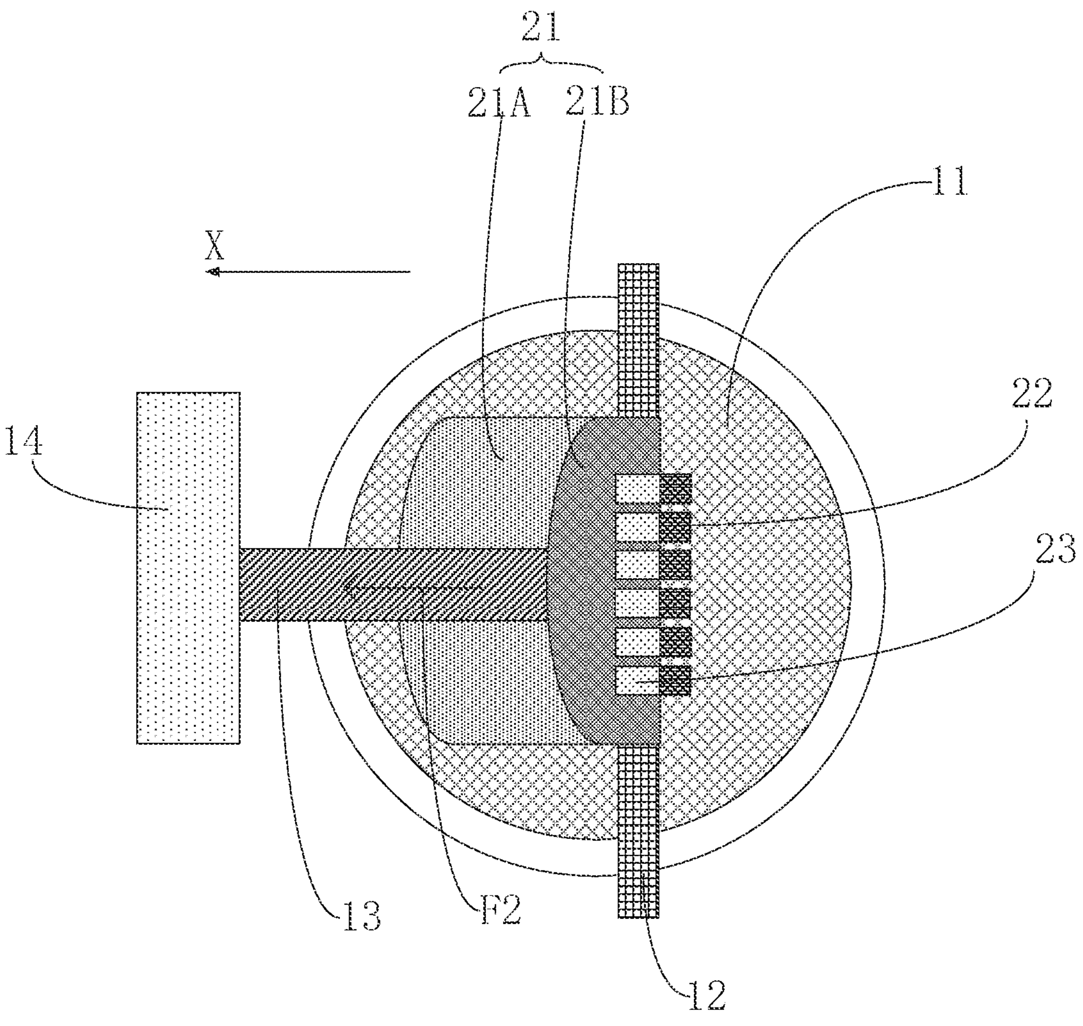
FIG. 8 is another schematic structure top view of a tape removing device provided in an implementation of the present disclosure while removing a support adhesive layer.
Figure 9:
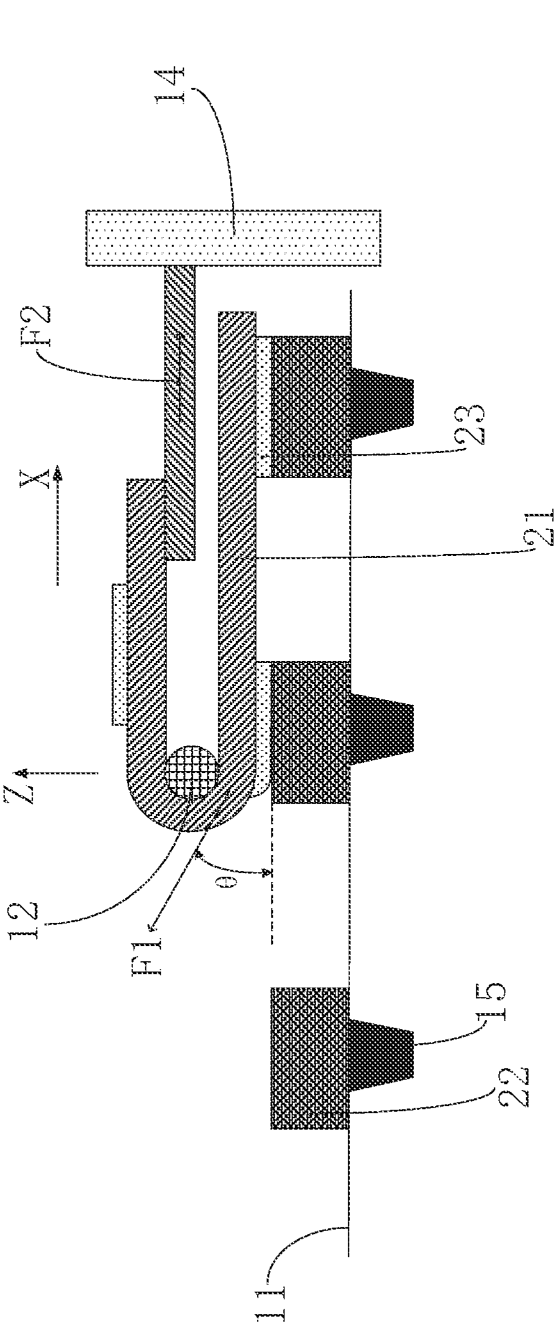
FIG. 9 is another schematic structure sectional view of a tape removing device provided in an implementation of the present disclosure while removing a support adhesive layer.

In the implementation in which the workpiece 22 in the workpiece for tape removing 20 is bonded with the support adhesive layer 21 via the bonding adhesive layer 23, as shown in FIGS. 8 and 9, the bonding force between the bonding adhesive layer 23 and the workpiece 22 in the workpiece for tape removing 20 may be smaller than the bonding force between the bonding adhesive layer 23 and the support adhesive layer 21 to provide that the bonding adhesive layer 23 along with the support adhesive layer 21 can detach from the workpiece 22 in the process of separating the support adhesive layer 21 from the workpiece 22.

In some implementations, as shown in FIGS. 1, 2, 8 and 9, the guiding roll 12 may be a cylinder and the cross-section shape of the guiding roll 12 may include geometry shapes including arcuate edges and/or bevel edges, such as circle, oval or polygon. In some examples, the guiding roll 12 may be a circular cylinder or a prism.

In some implementations, to facilitate applying the pulling force F1 to the support adhesive layer 21 in the workpiece for tape removing 20 in the start stage of separating the support adhesive layer 21 from the workpiece 22 at the preset angle θ smaller than 90 degrees, the tape removing device may further include a pulling tape 13 as shown in FIGS. 1, 2, 8 and 9. The separating unit may include a connecting sub-unit and a driving sub-unit, wherein the connecting sub-unit may be configured to connect the pulling tape 13 to the edge of the support adhesive layer 21 to be torn in the workpiece for tape removing 20, and the driving sub-unit may be configured to drive the edge of the support adhesive layer 21 to be torn in the workpiece for tape removing 20 to move in a preset direction X with the pulling tape 13 after the edge of the support adhesive layer 21 is guided by the guiding roll 12, such that the support adhesive layer 21 is separated from the workpiece 22 at the preset angle θ.

For example, the pulling tape 13 may have opposite first and second ends, and when the connecting sub-unit is connecting the pulling tape 13 to the edge of the support adhesive layer 21 to be torn in the workpiece for tape removing 20, it may attach the first end of the pulling tape 13 onto the edge of the support adhesive layer 21 at a side away from the surface 21A of the workpiece 22.

When driving the edge of the support adhesive layer 21 to be torn in the workpiece for tape removing 20 to move in the preset direction X with the pulling tape 13 after being guided by the guiding roll 12 such that the support adhesive layer 21 separates from the workpiece 22 at the preset angle θ, the driving sub-unit may apply a pulling force F2 in the preset direction X to the second end of the pulling tape 13 such that the pulling tape 13 can, under the action of the pulling force F2, drive the first side edge of the support adhesive layer 21 to be torn in the workpiece for tape removing 20 to move in the preset direction X after being guided by the guiding roll 12, thereby separating the support adhesive layer 21 from the workpiece 22 at the preset angle θ.

In some examples, the connecting sub-unit may include a winding up roller and a first motor. The pulling tape 13 has a preset length and may be wound around the winding up roller, wherein the winding up roller may rotate, and for example, may be a roller wheel. In the start stage of separating the support adhesive layer 21 from the workpiece 22 at the preset angle θ smaller than 90 degrees, the first motor can pull out the start end (namely the first end) of the pulling tape 13 wound around the winding up roller and attach the first end of the pulling tape 13 onto the edge of the support adhesive layer 21 at the side away from the surface 21A of the workpiece 22.

In some examples, the driving sub-unit may include a second motor, and after the first motor attaches the first end of the pulling tape 13 onto the edge of the support adhesive layer 21 at the side away from the surface 21A of the workpiece 22, the second motor can drive the winding up roller to move so as to drive the edge of the support adhesive layer 21 to be torn in the workpiece for tape removing 20 to move in a preset direction X with the pulling tape 13 after being guided by the guiding roll 12, such that the support adhesive layer 21 is separated from the workpiece 22 at the preset angle θ.

In some implementations, in the process of separating the support adhesive layer 21 from the workpiece 22 at the preset angle θ smaller than 90 degrees, the guiding roll 12 may roll in the preset direction X from the first side edge of the first surface of the workpiece for tape removing 20 away from the working table 11 to the second side edge of the first surface opposite to the first side edge, thereby completely separating the support adhesive layer 21 in the workpiece for tape removing 20 from the workpiece 22.

The axial direction of the guiding roll 12 may intersect with the preset direction X. In some examples, the axial direction of the guiding roll 12 may be perpendicular to the preset direction X. In some other examples, the axial direction of the guiding roll 12 and the preset direction X may be parallel to the working table 11.

In the process of separating the support adhesive layer 21 from the workpiece 22 at the preset angle θ smaller than 90 degrees, the guiding roll 12 may maintain aligned with the first side edge of the support adhesive layer 21 to be torn in the workpiece for tape removing 20 in the direction perpendicular to the workpiece 22 such that the guiding roll 12 can control the tearing angle of the support adhesive layer 21 better.

In some implementations, the adhesiveness of the pulling tape 13 may be greater than the adhesiveness of the support adhesive layer 21 such that the bonding force between the pulling tape 13 and the support adhesive layer 21 can be greater than the bonding force between the support adhesive layer 21 to be torn in the workpiece for tape removing 20 and the workpiece 22. Therefore, in the process of separating the support adhesive layer 21 to be torn in the workpiece for tape removing 20 from the workpiece 22, it is possible to avoid the case of failing to drive the edge of the support adhesive layer 21 to move in the preset direction X with the pulling tape 13 after being guided by the guiding roll 12 due to the separation of the pulling tape 13 and the support adhesive layer 21, which in turn avoids the problem of failing to separate the support adhesive layer 21 from the workpiece 22.

In some examples, the material for the pulling tape 13 may include silica gel. For example, the pulling tape 13 may be a silica gel tape.

In some implementations, the tape removing device may further include a control unit. The control unit may be configured to bring the guiding roll 12 to contact the surface 21A (namely the back side) of the support adhesive layer 21 in the workpiece for tape removing 20 away from the at least one workpiece 22 before the separating unit separates the support adhesive layer 21 from the workpiece 22.

When bringing the guiding roll 12 to contact the back side 21A of the support adhesive layer 21 in the workpiece for tape removing 20 away from the at least one workpiece 22, the control unit may make the cylinder surface of the guiding roll 12 abut against the surface of the workpiece for tape removing 20 away from the working table 11 so as to cause the support adhesive layer 21 in the workpiece for tape removing 20 to be stuck between the guiding roll 12 and the working table 11, which keeps the support adhesive layer 21 be separated from the workpiece 22 at the preset angle θ in the process of separating the support adhesive layer 21 from the workpiece 22, thereby improving the stability of tape removing operations.

In some examples, the control unit may include a motor and a movable rod. The end of the guiding roll 12 may be connected with the movable rod in the control unit, and the motor in the control unit can drive the movable rod to drive the guiding roll 12 to move in a preset direction Z such as the direction perpendicular to the working table 11, thereby controlling the guiding roll 12 to move away from or towards the surface 21A of the support adhesive layer 21 in the workpiece for tape removing 20 away from the at least one workpiece 22.

In some examples, the guiding roll 12 may be a roller wheel or a roller block. In examples in which the guiding roll 12 is a roller wheel, in the process of separating the support adhesive layer 21 from the workpiece 22 at the preset angle θ smaller than 90 degrees, the position of the guiding roll 12 may be fixed, and the tape removing device may control the working table 11 to move in a direction opposite to the preset direction X so as to drive the guiding roll 12 to rotate in situ with the friction force between the support adhesive layer 21 to be torn and the guiding roll 12, which in turn drives the torn support adhesive layer 21 to move in the preset direction X after being guided by the guiding roll 12.

In examples in which the guiding roll 12 is a roller block, in the process of separating the support adhesive layer 21 from the workpiece 22 at the preset angle θ smaller than 90 degrees, the position of the working table 11 may be fixed, and the tape removing device may control the guiding roll 12 to move in the preset direction X so as to cause the torn support adhesive layer 21 to move in the preset direction X after being guided by the guiding roll 12.

In some implementations, as shown in FIGS. 8 and 9, the tape removing device may further include a collecting unit 14 that may be configured to collect the separated support adhesive layer 21 (e.g., the support adhesive layer 21 that has been torn off) for automatic collection of waste tape, thereby improving the efficiency of tape removing operation.

In the implementation in which the tape removing device includes a pulling tape 13 and the separating unit includes a connecting sub-unit and a driving sub-unit, the connecting sub-unit may be further configured to connect the pulling tape 13 to the collecting unit 14, for example, connecting the second end of the pulling tape 13 to the collecting unit 14.

In some implementations, the collecting unit 14 may include a winding drum, and the driving sub-unit may be further configured to drive the winding drum to rotate so as to wind the separated support adhesive layer 21 around the winding drum.

Instead of the implementation in which the driving sub-unit drives the winding drum to rotate so as to wind the separated support adhesive layer 21 around the winding drum, in some implementations, the collecting unit 14 may include a rotating sub-unit that may be configured to collect the separated support adhesive layer 21. For example, while collecting the separated support adhesive layer 21, the rotating sub-unit may drive the winding drum to rotate so as to wind the separated support adhesive layer 21 around the winding drum.

In the above-described implementation, when the connecting sub-unit includes a winding up roller and a first motor and the driving sub-unit includes a second motor, in the start stage of separating the support adhesive layer 21 from the workpiece 22 at the preset angle θ smaller than 90 degrees, the second motor in the driving sub-unit can drive the winding up roller to move after the first motor attaches the first end of the pulling tape 13 onto the edge of the support adhesive layer 21 at the side away from the surface 21A of the workpiece 22 so as to pass the pulling tape 13 on the winding up roller onto the winding drum in the collecting unit. And in the middle stage of separating the support adhesive layer 21 from the workpiece 22 at the preset angle θ smaller than 90 degrees, the second motor or the rotating sub-unit in the collecting unit can drive the winding drum in the collecting unit to rotate so as to wind the pulling tape 13 and the separated support adhesive layer 21 around the winding drum.

In some application scenarios, in the start stage of separating the support adhesive layer 21 from the workpiece 22 at the preset angle θ smaller than 90 degrees, the opposite first and second ends of the pulling tape 13 may be connected with the first side edge of the support adhesive layer 21 away from the back side 21A in the workpiece for tape removing 20 and the winding drum in the collecting unit 14 respectively; in the middle stage of separating the support adhesive layer 21 from the workpiece 22 at the preset angle θ smaller than 90 degrees, the winding drum may rotate to wind the pulling tape 13 and the separated support adhesive layer 21 around the winding drum, and in the process of winding the pulling tape 13 around the winding drum, the edge of the support adhesive layer 21 to be torn in the workpiece for tape removing 20 would be raised under the traction of the pulling tape 13 and the torn support adhesive layer 21 and wound around the winding drum after being guided by the guiding roll 12, thereby realizing automatic collection of the torn support adhesive layer 21 while stripping off the support adhesive layer 21, hence saving manpower and time costs as compared to manual collection of the torn support adhesive layer 21.

In some implementations, as shown in FIGS. 8 and 9, the fixing unit may include at least one suction nozzle 15 disposed on the working table and configured to suck and fix the at least one workpiece 22 on the working table 11.

For example, the tape removing device may include a workbench for providing the working table 11 and when the workpiece for tape removing 20 is placed on the workbench, the workpiece for tape removing 20 may be placed on the workbench such that the surface of the workpiece for tape removing 20 on which the at least one workpiece 22 is disposed faces the workbench. The suction nozzle 15 may include a vacuum channel for providing a vacuum pressure, and the vacuum channel is disposed in the workbench and sucks and fixes the workpiece 22 on the working table 11 with the vacuum pressure.

In some application scenarios, each workpiece 22 in the workpiece for tape removing 20 may correspond to one suction nozzle 15 and may be sucked and fixed on the working table 11 by suction by its corresponding suction nozzle 15. In an implementation, the fixing positions of workpieces 22 in the workpiece for tape removing 20 on the support adhesive layer 21 may correspond to placement positions of suction nozzles 15 on the working table 11. The positions may provide that workpieces 22 in the workpiece for tape removing 20 can be sucked by respective nozzles 15 after the workpiece for tape removing 20 is placed on the working table 11. In this way, the surface of the workpiece for tape removing 20 on which the at least one workpiece 22 is disposed faces the working table 11.

In some other application scenarios, the number of workpieces 22 in the workpiece for tape removing 20 may be plurality and the plurality of workpieces 22 may be arranged in rows. And while the fixing unit is fixing the workpiece for tape removing 20 on the working table 11, the row direction of rows of workpieces 22 in the workpiece for tape removing 20 may intersect with the preset direction X, and in some examples, the row direction of rows of workpieces 22 in the workpiece for tape removing 20 may be perpendicular to the preset direction X. Therefore, it is possible for the separating unit in the tape removing device to strip away the workpieces 22 row by row from the support adhesive layer 21, and in the process in which the separating unit separates the support adhesive layer 21 in the workpiece for tape removing 20 from the workpieces 22 at the preset angle θ after being guided by the guiding roll 12, the fixing unit can simply use nozzles 15 as many as the workpieces 22 contained in one row of workpieces 22 that are currently striped to fix the row of workpieces 22, thereby reducing the number of nozzles 15 that are needed, facilitating cost reduction.

In some implementations, the tape removing device may further include a transferring unit that may be configured to transfer the workpieces on the working table 11 to the tray after the separating unit has separated the support adhesive layer 21 in the workpiece for tape removing 20 from the workpieces 22 at the preset angle θ after being guided by the guiding roll 12. The transferring unit may transfer workpieces 22 from the working table 11 to the plastic tray by sucking exposed back side of workpieces 22 on the working table 11.

In some examples, the transferring unit may include at least one suction nozzle for sucking the workpieces 22. After the separating unit has separated the support adhesive layer 21 in the workpiece for tape removing 20 from the workpieces 22 at the preset angle θ after being guided by the guiding roll 12, the suction nozzle for sucking workpieces 22 in the transferring unit can suck exposed back sides of workpieces 22 on the working table 11 to transfer workpieces 22 from the working table 11 to the plastic tray.

In some implementations in which workpieces 22 are removed from the support adhesive layer 21 and placed in the tray by sucking the front side of workpieces 22 one by one, problems therewith include invisible cracks in workpieces 22, low production capacity and possible failure to pick up materials. In the present implementation, it is possible not only to reduce the risk of invisible cracks in workpieces 22, but also provide high production capacity and avoid failure to pick up materials by sucking exposed back side of workpieces 22 on the working table 11 after stripping workpieces 22 off the support adhesive layer 21 row by row or all at once to remove the workpieces 22 from the working table 11 and transfer them to the tray.

As determined from the above description, with the tape removing device provided in implementations of the present disclosure, when removing a support adhesive layer, it is possible to strip the support adhesive layer off a workpiece at an angle smaller than 90 degrees by fixing, with the fixing unit, the workpiece for tape removing including the support adhesive layer and at least one workpiece bonded to one side of the support adhesive layer on the working table with the side of the support adhesive layer on which the at least one workpiece is disposed facing the working table, and separating, with the separating unit, the support adhesive layer from the workpiece at a preset angle smaller than 90 degrees after being guided by the guiding roll, thereby avoiding tearing the support adhesive layer from the workpiece at a right angle. Therefore, it is possible to reduce the stripping force on the workpiece to reduce damages to the workpiece, which in turn can reduce the risk of invisible product cracks and improve product reliability.

Figure 10:
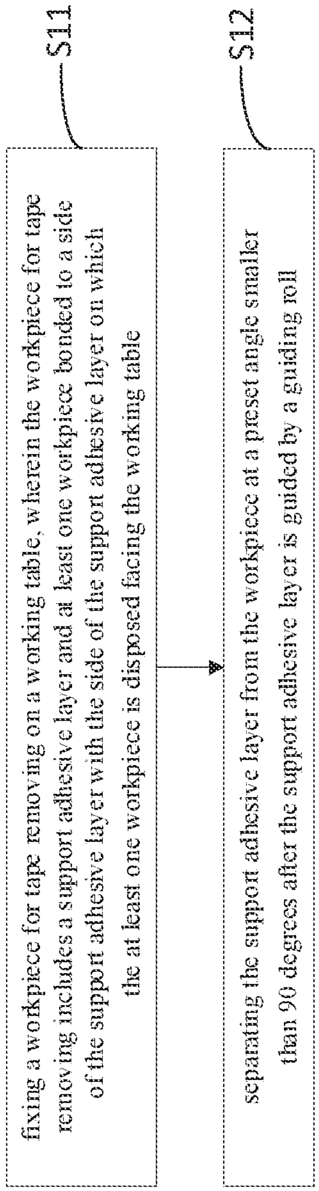
FIG. 10 is a schematic flow chart of a tape removing method provided in an implementation of the present disclosure.

FIG. 10 is a schematic flow chart of a tape removing method provided in some implementation of the present disclosure. The tape removing method may be applied to the tape removing device, which may be the tape removing device in any of the above-described implementations. As shown in FIG. 10, the tape removing method includes the following operations.

Operation S11: fixing a workpiece for tape removing on a working table, wherein the workpiece for tape removing includes a support adhesive layer and at least one workpiece bonded to a side of the support adhesive layer with the side of the support adhesive layer on which the at least one workpiece is disposed facing the working table.

Operation S12: separating the support adhesive layer from the workpiece at a preset angle smaller than 90 degrees after the support adhesive layer is guided by a guiding roll.

In some implementations, the guiding roll may be a cylinder and the cross-section shape of cylinder may include geometry shapes such as circle, oval or polygon.

In some implementations, the preset angle may be between 30 to 60 degrees.

In some implementations, at least one suction nozzle may be disposed on the working table, and the operation S11 may include sucking and fixing the at least one workpiece on the working table by the at least one suction nozzle.

In some implementations, the operation S12 may include:

operation S121: connecting the pulling tape to an edge of the support adhesive layer; and operation S122: driving, with the pulling tape, the edge of the support adhesive layer to move in a preset direction after being guided by the guiding roll so as to separate the support adhesive layer from the workpiece at the preset angle with the axial direction of the guiding roll intersecting with the preset direction.

In some implementations, the adhesiveness of the pulling tape may be greater than that of the support adhesive layer.

In some implementations, the workpiece for tape removing may further include at least one bonding adhesive layer located between the support adhesive layer and the at least one workpiece, and the at least one workpiece may be bonded with the support adhesive layer respectively by the at least one bonding adhesive layer.

Accordingly, the operation S12 may include separating the support adhesive layer and the bonding adhesive layer from the workpiece at the preset angle after being guided by the guiding roll.

Accordingly, the operation S122 may include: driving, with the pulling tape, the edge of the support adhesive layer to move in the preset direction after being guided by the guiding roll so as to separate the support adhesive layer and the bonding adhesive layer from the workpiece at the preset angle.

In some implementations, before the operation S12, the tape removing method further includes:

operation S13: bringing the guiding roll to contact the surface of the support adhesive layer away from the at least one workpiece.

In some implementations, the tape removing method may further include:

operation S14: collecting the separated support adhesive layer.

In some implementations, the operation S14 may include: rolling the separated support adhesive layer around a rolling drum.

It is to be noted that respective descriptions of the implementations of the above-described tape removing device may be referred to for implementation process and useful effects of operations in the tape removing method of the present implementation, which will not be repeated here for convenience and conciseness of description.

As determined from the above description, with the tape removing method provided in implementations of the present disclosure, when removing a support adhesive layer, it is possible to strip the support adhesive layer off a workpiece at an angle smaller than 90 degrees by fixing a workpiece for tape removing including the support adhesive layer and at least one workpiece bonded to one side of the support adhesive layer on the working table with the side of the support adhesive layer on which the at least one workpiece is disposed facing the working table and then separating the support adhesive layer from the workpiece at a preset angle smaller than 90 degrees after being guided by a guiding roll, thereby avoiding tearing the support adhesive layer from the workpiece at a right angle. Therefore, it is possible to reduce the stripping force on the workpiece to reduce damages to the workpiece, which in turn can reduce the risk of invisible product cracks and improve product reliability.

What have been described above are only preferred implementations of the present disclosure and not intended to limit the present disclosure. Any modifications, equivalent substitutions and improvements made within the spirit and principle of the present disclosure should be covered by the scope of the present disclosure.

What is claimed is:

1. A tape removing device, comprising:

a working table;

a suction nozzle;

a workpiece for tape removing, the workpiece for tape removing including a support adhesive layer and at least one workpiece bonded to a side of the support adhesive layer, in which one side of the support adhesive layer provided with the at least one workpiece is facing the working table;

a collecting unit configured to collect the support adhesive layer after separation from the workpiece; and a guiding roll in contact with the other side of the support adhesive layer, wherein the suction nozzle fixes the at least one workpiece on the working table.

2. The tape removing device of claim 1, further comprising a pulling tape, wherein the pulling tape is coupled to an edge of the support adhesive layer.

3. The tape removing device of claim 2, wherein an adhesiveness of the pulling tape is greater than that of the support adhesive layer.

4. The tape removing device of claim 2, wherein the collecting unit is coupled to the pulling tape.

5. The tape removing device of claim 1, wherein the support adhesive layer is separated from the workpiece at a preset angle through the guiding roll, and the preset angle is smaller than 90 degrees.

6. The tape removing device of claim 5, wherein the workpiece for tape removing further comprises at least one bonding adhesive layer located between the support adhesive layer and the at least one workpiece, wherein the at least one workpiece is bonded with the support adhesive layer respectively by the at least one bonding adhesive layer, and the support adhesive layer and the bonding adhesive layer are separated from the workpiece at the preset angle after being guided by the guiding roll.

7. The tape removing device of claim 5, wherein the preset angle is between 30 to 60 degrees.

8. The tape removing device of claim 1, further comprising multiple suction nozzles, wherein a number of the suction nozzles corresponds one to one with a number of workpieces of the workpiece for tape removing.

9. The tape removing device of claim 1, wherein the guiding roll is a cylinder and a cross-section shape of the cylinder comprises a circle, oval or polygon.

10. The tape removing device of claim 6, wherein the tape removing device is configured to irradiate the workpiece for tape removing with an ultraviolet light to reduce an adhesiveness of the bonding adhesive layer.

11. A tape removing method, comprising:

fixing a workpiece for tape removing on a working table by sucking and fixing the workpiece for tape removing on the working table by at least one suction nozzle, the workpiece for tape removing comprising a support adhesive layer and at least one workpiece bonded to a side of the support adhesive layer and sucked by the at least one suction nozzle, the side of the support adhesive layer on which the at least one workpiece is disposed facing the working table; and separating the support adhesive layer from the workpiece at a preset angle smaller than 90 degrees after the support adhesive layer is guided by a guiding roll, wherein separating the support adhesive layer from the workpiece comprises breaking an electromagnetic shield layer covering the workpiece.

12. The tape removing method of claim 11, wherein separating the support adhesive layer from the workpiece at the preset angle after the support adhesive layer is guided by the guiding roll comprises:

connecting a pulling tape to an edge of the support adhesive layer; and driving, with the pulling tape, the edge of the support adhesive layer to move in a preset direction after the edge of the support adhesive layer is guided by the guiding roll so as to separate the support adhesive layer from the workpiece at the preset angle with an axial direction of the guiding roll intersecting with the preset direction.

13. The tape removing method of claim 12, wherein an adhesiveness of the pulling tape is greater than that of the support adhesive layer.

14. The tape removing method of claim 12, further comprising bringing the guiding roll to contact a surface of the support adhesive layer away from the at least one workpiece before separating the support adhesive layer from the workpiece.

15. The tape removing method of claim 12, further comprising collecting the separated support adhesive layer.

16. The tape removing method of claim 15, wherein collecting separated support adhesive layer comprises:

connecting the pulling tape to a collecting unit; and collecting the separated support adhesive layer through the collecting unit.

17. The tape removing method of claim 11, wherein the workpiece for tape removing further comprises at least one bonding adhesive layer located between the support adhesive layer and the at least one workpiece, wherein the at least one workpiece is bonded with the support adhesive layer by the at least one bonding adhesive layer, and wherein separating the support adhesive layer from the workpiece at the preset angle after the support adhesive layer is guided by the guiding roll comprises separating the support adhesive layer and the bonding adhesive layer from the workpiece at the preset angle after the support adhesive layer and the bonding adhesive layer are guided by the guiding roll.

18. The tape removing method of claim 11, wherein the guiding roll is a cylinder and a cross-section shape of the cylinder comprises a circle, oval or polygon.

19. The tape removing method of claim 11, wherein the preset angle is between 30 to 60 degrees.

20. The tape removing method of claim 17, further comprising irradiating the workpiece for tape removing with an ultraviolet light to reduce an adhesiveness of the bonding adhesive layer.

* * * * *